(12) United States Patent
Benvegnu et al.

(10) Patent No.: US 12,288,724 B2
(45) Date of Patent: *Apr. 29, 2025

(54) REGION CLASSIFICATION OF FILM NON-UNIFORMITY BASED ON PROCESSING OF SUBSTRATE IMAGES

(71) Applicant: Applied Materials, Inc., Santa Clara, CA (US)

(72) Inventors: Dominic J. Benvegnu, La Honda, CA (US); Nojan Motamedi, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 374 days.

This patent is subject to a terminal disclaimer.

(21) Appl. No.: 17/680,167

(22) Filed: Feb. 24, 2022

(65) Prior Publication Data

US 2022/0284562 A1 Sep. 8, 2022

Related U.S. Application Data

(60) Provisional application No. 63/156,856, filed on Mar. 4, 2021.

(51) Int. Cl.
*H01L 21/66* (2006.01)
*G01N 21/95* (2006.01)
(Continued)

(52) U.S. Cl.
CPC ......... *H01L 22/12* (2013.01); *G01N 21/9501* (2013.01); *G06T 7/0004* (2013.01);
(Continued)

(58) Field of Classification Search
CPC .............. H01L 22/12; H01L 21/30625; G01N 21/9501; G01N 21/8422; G01N 21/95607;
(Continued)

(56) References Cited

U.S. PATENT DOCUMENTS 5,738,574 A 4/1998 Tolles et al.
5,823,853 A 10/1998 Bartels et al.
(Continued)

FOREIGN PATENT DOCUMENTS

CN 104982026 10/2015
CN 105354281 2/2016
(Continued)

OTHER PUBLICATIONS

Office Action in Taiwanese Appln. No. 112115313, dated Jun. 30, 2023, 10 pages (with English search report).
(Continued)

*Primary Examiner* — Matthew C Bella
*Assistant Examiner* — Andrew B. Jones
(74) *Attorney, Agent, or Firm* — Fish & Richardson P.C.

(57) ABSTRACT

A method of classification of a film non-uniformity on a substrate includes obtaining a color image of a substrate with the color image comprising a plurality of color channels, obtaining a standard color for the color image of the substrate, for each respective pixel along a path in the color image determining a difference vector between the a color of the respective pixel and the standard color to generate a sequence of difference vectors, sorting the pixels along the path into a plurality of regions including at least one normal region and at least one abnormal region based on the sequence of difference vectors, and classifying the at least one abnormal region as overpolished or underpolished based on at least one difference vector of a pixel at a boundary between the abnormal region and an adjacent normal region.

20 Claims, 9 Drawing Sheets

(51) Int. Cl.
  *G06T 7/00* (2017.01)
  *G06T 7/10* (2017.01)
  *G06T 7/90* (2017.01)
  *H01L 21/306* (2006.01)

(52) U.S. Cl.
  CPC ............... *G06T 7/001* (2013.01); *G06T 7/10* (2017.01); *G06T 7/90* (2017.01); *H01L 21/30625* (2013.01); *G06T 2207/10024* (2013.01); *G06T 2207/20072* (2013.01); *G06T 2207/30148* (2013.01)

(58) Field of Classification Search
  CPC ....... G01N 21/8851; G01N 2021/8854; G01N 2021/8887; G06T 7/0004; G06T 7/001; G06T 7/10; G06T 7/90; G06T 2207/10024; G06T 2207/20072; G06T 2207/30148; B24B 37/105; B24B 37/205; B24B 49/12
  See application file for complete search history.

(56) References Cited

U.S. PATENT DOCUMENTS

| | | | |
|---|---|---|---|
| 5,911,003 | A | 6/1999 | Sones |
| 6,004,187 | A | 12/1999 | Nyui et al. |
| 6,071,177 | A | 6/2000 | Lin et al. |
| 6,106,662 | A | 8/2000 | Bibby et al. |
| 6,111,634 | A | 8/2000 | Pecen et al. |
| 6,142,855 | A | 11/2000 | Nyui et al. |
| 6,190,234 | B1 | 2/2001 | Swedek et al. |
| 6,191,864 | B1 | 2/2001 | Sandhu |
| 6,290,572 | B1 | 9/2001 | Hofmann |
| 6,358,362 | B1 | 3/2002 | En et al. |
| 6,361,646 | B1 | 3/2002 | Bibby et al. |
| 6,466,642 | B1 | 10/2002 | Meloni |
| 6,511,363 | B2 | 1/2003 | Yamane et al. |
| 6,517,413 | B1 | 2/2003 | Hu et al. |
| 6,618,130 | B2 | 9/2003 | Chen |
| 6,930,782 | B1 | 8/2005 | Yi et al. |
| 7,008,295 | B2 | 3/2006 | Wiswesser et al. |
| 7,018,271 | B2 | 3/2006 | Wiswesser et al. |
| 7,300,332 | B2 | 11/2007 | Kobayashi et al. |
| 7,406,394 | B2 | 7/2008 | Swedek et al. |
| 7,438,627 | B2 | 10/2008 | Kobayashi et al. |
| 7,645,181 | B2 | 1/2010 | Kobayashi et al. |
| 7,840,375 | B2 | 11/2010 | Ravid et al. |
| 8,045,142 | B2 | 10/2011 | Kimba |
| 8,088,298 | B2 | 1/2012 | Swedek et al. |
| 8,157,616 | B2 | 4/2012 | Shimizu et al. |
| 8,292,693 | B2 | 10/2012 | David et al. |
| 8,657,646 | B2 | 2/2014 | Benvegnu et al. |
| 8,814,631 | B2 | 8/2014 | David et al. |
| 9,095,952 | B2 | 8/2015 | Benvegnu et al. |
| 9,106,771 | B2 | 8/2015 | Kitai |
| 9,822,460 | B2 | 11/2017 | Dineen et al. |
| 10,325,364 | B2 | 6/2019 | Benvegnu |
| 10,563,973 | B2 | 2/2020 | Li et al. |
| 11,017,524 | B2 | 5/2021 | Benvegnu |
| 2002/0016066 | A1 | 2/2002 | Birang et al. |
| 2002/0055192 | A1 | 5/2002 | Redeker et al. |
| 2002/0159626 | A1 | 10/2002 | Shiomi et al. |
| 2003/0007677 | A1 | 1/2003 | Hiroi et al. |
| 2003/0182051 | A1 | 9/2003 | Yamamoto |
| 2003/0184742 | A1 | 10/2003 | Stanke et al. |
| 2003/0205664 | A1 | 11/2003 | Abe et al. |
| 2003/0207651 | A1 | 11/2003 | Kim et al. |
| 2004/0012795 | A1 | 1/2004 | Moore |
| 2004/0028267 | A1* | 2/2004 | Shoham .................. G06T 7/001 382/141 |
| 2004/0058543 | A1 | 3/2004 | Bothra |
| 2004/0080757 | A1 | 4/2004 | Stanke et al. |
| 2004/0259472 | A1 | 12/2004 | Chalmers et al. |
| 2005/0013481 | A1 | 1/2005 | Toba |
| 2005/0026542 | A1 | 2/2005 | Battal et al. |
| 2005/0042975 | A1 | 2/2005 | David |
| 2005/0089216 | A1 | 4/2005 | Schiller et al. |
| 2005/0213793 | A1 | 9/2005 | Oya et al. |
| 2005/0244049 | A1 | 11/2005 | Onishi et al. |
| 2006/0017855 | A1 | 1/2006 | Yamada |
| 2006/0020419 | A1 | 1/2006 | Benvegnu |
| 2006/0061746 | A1 | 3/2006 | Kok et al. |
| 2006/0166608 | A1 | 7/2006 | Chalmers et al. |
| 2007/0042675 | A1 | 2/2007 | Benvegnu et al. |
| 2007/0077671 | A1 | 4/2007 | David et al. |
| 2007/0206843 | A1 | 9/2007 | Douglass et al. |
| 2008/0099443 | A1 | 5/2008 | Benvegnu et al. |
| 2008/0117226 | A1 | 5/2008 | Edge et al. |
| 2009/0014409 | A1 | 1/2009 | Grimbergen |
| 2009/0153352 | A1 | 6/2009 | Julio |
| 2009/0153859 | A1 | 6/2009 | Kimba |
| 2009/0298387 | A1 | 12/2009 | Shimizu et al. |
| 2010/0015889 | A1 | 1/2010 | Shimizu et al. |
| 2010/0067010 | A1 | 3/2010 | Sakai et al. |
| 2010/0093260 | A1 | 4/2010 | Kobayashi et al. |
| 2010/0124870 | A1 | 5/2010 | Benvegnu et al. |
| 2011/0104987 | A1 | 5/2011 | David et al. |
| 2011/0275281 | A1 | 11/2011 | David et al. |
| 2011/0318992 | A1 | 12/2011 | David et al. |
| 2012/0019830 | A1 | 1/2012 | Kimba |
| 2012/0021672 | A1 | 1/2012 | David et al. |
| 2012/0026492 | A1 | 2/2012 | Zhang et al. |
| 2012/0034844 | A1 | 2/2012 | Zhang et al. |
| 2012/0129277 | A1 | 5/2012 | Lahiri et al. |
| 2012/0289124 | A1 | 11/2012 | Benvegnu et al. |
| 2013/0052916 | A1 | 2/2013 | David et al. |
| 2013/0149938 | A1 | 6/2013 | Kobayashi et al. |
| 2013/0280989 | A1 | 10/2013 | Lee et al. |
| 2013/0288571 | A1 | 10/2013 | David et al. |
| 2013/0344625 | A1 | 12/2013 | Benvegnu et al. |
| 2014/0011429 | A1 | 1/2014 | David et al. |
| 2014/0148008 | A1 | 5/2014 | Wu |
| 2014/0206259 | A1 | 7/2014 | Benvegnu et al. |
| 2015/0017745 | A1 | 1/2015 | Kimba et al. |
| 2015/0220809 | A1 | 8/2015 | Kawabata et al. |
| 2015/0318327 | A1 | 11/2015 | Zheng et al. |
| 2015/0364387 | A1 | 12/2015 | Cho et al. |
| 2016/0121451 | A1 | 5/2016 | Moore |
| 2017/0140525 | A1 | 5/2017 | Benvegnu et al. |
| 2018/0061032 | A1* | 3/2018 | Benvegnu ............ B24B 37/013 |
| 2018/0197052 | A1* | 7/2018 | Yanson ............ G06K 19/06037 |
| 2019/0244374 | A1 | 8/2019 | Benvegnu et al. |
| 2019/0295239 | A1 | 9/2019 | Benvegnu |
| 2020/0258214 | A1 | 8/2020 | Motamedi et al. |
| 2020/0357836 | A1 | 11/2020 | Miyata et al. |
| 2021/0248730 | A1 | 8/2021 | Benvegnu |
| 2022/0285227 | A1 | 9/2022 | Benvegnu et al. |

FOREIGN PATENT DOCUMENTS

| | | |
|---|---|---|
| CN | 105957878 | 9/2016 |
| JP | S62-042006 | 2/1987 |
| JP | S63-221209 | 9/1988 |
| JP | H11-207614 | 8/1999 |
| JP | 2000-033561 A | 2/2000 |
| JP | 2001-345299 | 12/2001 |
| JP | 2002-359217 | 12/2002 |
| JP | 2003-346285 | 12/2003 |
| JP | 2004-009259 | 1/2004 |
| JP | 2004-279297 | 10/2004 |
| JP | 2005-129065 | 5/2005 |
| JP | 2010-021417 | 1/2010 |
| JP | 2010-093147 | 4/2010 |
| KR | 10-2017-0048984 | 5/2017 |
| TW | 200407528 | 5/2004 |
| TW | 200512476 | 4/2005 |
| TW | 201213050 | 4/2012 |
| TW | 201249598 | 12/2012 |
| TW | 201538804 | 10/2015 |
| TW | 201620676 | 6/2016 |
| TW | I549277 | 9/2016 |
| TW | 201938693 | 10/2019 |

(56) References Cited

FOREIGN PATENT DOCUMENTS

| TW | 202043697 | 12/2020 |
|----|-----------|---------|
| WO | WO 2011/094706 | 8/2011 |
| WO | WO 2012/148716 | 11/2012 |

OTHER PUBLICATIONS

International Search Report and Written Opinion in International Appln. No. PCT/US2022/017764, dated Jun. 17, 2022, 10 pages.
Office Action in Taiwanese Appln. No. 111107949, dated Oct. 12, 2022, 13 pages (with English search report).
Office Action in Japanese Appln. No. 2023-553541, dated Dec. 3, 2024, 6 pages (with English translation).

\* cited by examiner

REGION CLASSIFICATION OF FILM NON-UNIFORMITY BASED ON PROCESSING OF SUBSTRATE IMAGES

CROSS-REFERENCE TO RELATED APPLICATIONS

This application claims priority to U.S. Application Ser. No. 63/156,856, filed on Mar. 4, 2021, the disclosure of which is incorporated by reference.

TECHNICAL FIELD

This disclosure relates to optical metrology, e.g., techniques to classify non-uniformity of a film on a substrate.

BACKGROUND

An integrated circuit is typically formed on a substrate by the sequential deposition of conductive, semiconductive, or insulative layers on a silicon wafer. Planarization of a substrate surface may be required for the removal of a filler layer or to improve planarity for photolithography during fabrication of the integrated circuit.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

Various optical metrology systems, e.g., spectrographic or ellipsometric, can be used to measure the thickness of the substrate layer pre-polishing and post-polishing, e.g., at an in-line or stand-alone metrology station.

As a parallel issue, advancements in hardware resources such as Graphical Processing Units (GPU) and Tensor Processing Units (TPU) have resulted in a vast improvement in the deep learning algorithms and their applications. One of the evolving fields of deep learning is computer vision and image recognition. Such computer vision algorithms are mostly designed for image classification or segmentation.

SUMMARY

In one aspect, a method of classification of a film non-uniformity on a substrate includes obtaining a color image of a substrate with the color image comprising a plurality of color channels, obtaining a standard color for the color image of the substrate, for each respective pixel along a path in the color image determining a difference vector between the a color of the respective pixel and the standard color to generate a sequence of difference vectors, and sorting the pixels along the path into a plurality of regions including at least one normal region and at least one abnormal region based on the sequence of difference vectors, including comparing a multiplicity of the difference vectors in the sequence to a threshold.

In another aspect, a computer program product can be provided to classify the film.

In another aspect, a chemical mechanical polishing system includes a control system configured to classify the film.

Implementations can include one or more of the following potential advantages. Abnormalities in a film on a substrate, e.g., non-uniformity in thickness, and presence of residue or defects, can be analyzed quickly. In some implementations, abnormality in a film on a substrate can be analyzed quickly for die-to-die measurements. For example, an in-line metrology system can measure film abnormalities for a substrate based on color images of the substrate. The measured abnormality, e.g., the measured non-uniformity, can be used to control polishing parameters to compensate for underpolishing and overpolishing of a substrate.

The described approach can use color values in a sequence of pixels to detect an abnormality in the film of a substrate and classify the type of abnormality. A model can be trained to determine different types of abnormalities based on color values.

The metrology system can have high inference speed and superior detection and classification of non-uniform regions. The approach can also take into consideration sublayer variation.

The details of one or more implementations are set forth in the accompanying drawings and the description below. Other aspects, features and advantages will be apparent from the description and drawings, and from the claims.

DESCRIPTION OF DRAWINGS

Like reference symbols in the various drawings indicate like elements.

DETAILED DESCRIPTION

Thin-film thickness measurements from dry metrology systems are used in CMP processing because of the variability in the polishing rate that occurs in CMP processes. Such dry metrology measurement techniques often use a spectrographic or ellipsometric approach in which variables in an optical model of a film stack are fit to the collected measurements. Such measurement techniques typically require precise alignment of a sensor to a measurement spot of the substrate to ensure that the model is applicable to the collected measurements. Therefore, measuring a large number of points on the substrate can be time-consuming, and classification of the type and the degree of under- and over-polishing might not be feasible as imposing an unacceptable reduction in throughput.

However, an image processing technique based on color images can provide faster detection of abnormalities on the substrate and classification of the type of abnormality with satisfactory accuracy. In particular, the color images of dies from a substrate can be divided into multiple regions. Each region can be divided into multiple areas of the same or similar color. For example, a pixel with a color vector that is sufficiently close to a target vector can be classified as properly polished; pixels that fail the test can be classified as abnormality. In one implementation, for each of a plurality of paths across the substrate, the color of each pixel along the path can be analyzed, and the type and the degree of abnormality can be determined based on the sequence of vectors in color space for pixels at the boundary between the properly polished regions and improperly polished regions along the path. For example, whether regions are over-polished or under-polished relative to other regions, and the degree of over-polishing or under-polishing, can be determined based on the vectors.

Figure 1:
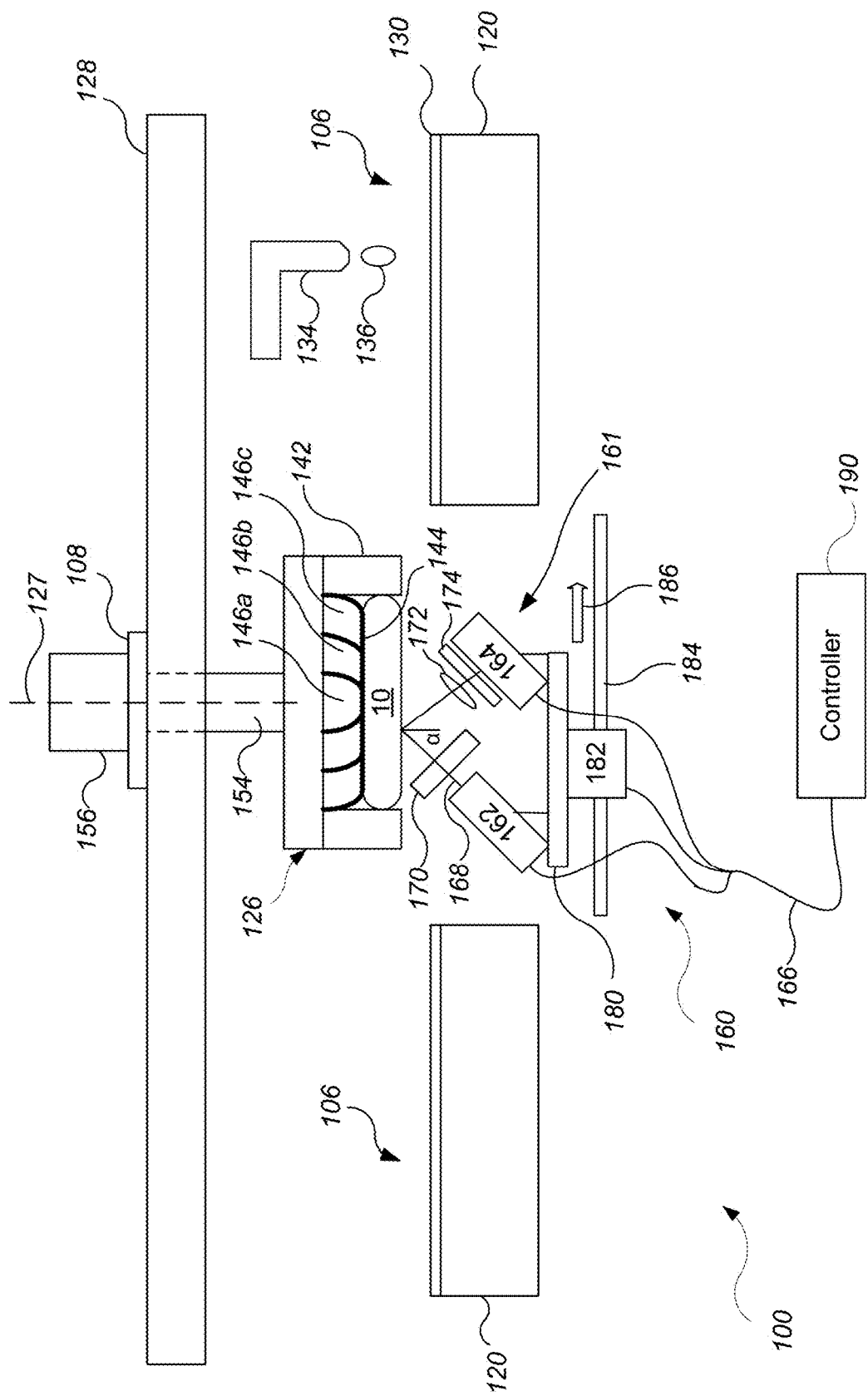
FIG. 1 illustrates a view of an example of an in-line optical measurement system.

Referring to FIG. 1, a polishing apparatus 100 includes one or more carrier heads 126, each of which is configured to carry a substrate 10, one or more polishing stations 106, and a transfer station to load substrate to and unload substrates from a carrier head. Each polishing station 106 includes a polishing pad 130 supported on a platen 120. The polishing pad 130 can be a two-layer polishing pad with an outer polishing layer and a softer backing layer.

The carrier heads 126 can be suspended from a support 128, and movable between the polishing stations. In some implementations, the support 128 is an overhead track and each carrier head 126 is coupled to a carriage 108 that is mounted to the track so that each carriage 108 can be selectively moved between the polishing stations 124 and the transfer station. Alternatively, in some implementations, the support 128 is a rotatable carousel, and rotation of the carousel moves the carrier heads 126 simultaneously along a circular path.

Each polishing station 106 of the polishing apparatus 100 can include a port, e.g., at the end of an arm 134, to dispense polishing liquid 136, such as abrasive slurry, onto the polishing pad 130. Each polishing station 106 of the polishing apparatus 100 can also include pad conditioning apparatus to abrade the polishing pad 130 to maintain the polishing pad 130 in a consistent abrasive state.

Each carrier head 126 is operable to hold a substrate 10 against the polishing pad 130. Each carrier head 126 can have independent control of the polishing parameters, for example, pressure associated with each respective substrate. In particular, each carrier head 126 can include a retaining ring 142 to retain the substrate 10 below a flexible membrane 144. Each carrier head 126 can also include a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

Each carrier head 126 is suspended from the support 128 and is connected by a drive shaft 154 to a carrier head rotation motor 156 so that the carrier head can rotate about an axis 127. Optionally each carrier head 126 can oscillate laterally, e.g., by driving the carriage 108 on a track, or by the rotational oscillation of the carousel itself. In operation, the platen is rotated about its central axis, and each carrier head is rotated about its central axis 127 and translated laterally across the top surface of the polishing pad.

A controller 190, such as a programmable computer, provides a control system. The controller 190 is connected to each motor to independently control the rotation rate of the platen 120 and the carrier heads 126. The controller 190 can include a central processing unit (CPU), a memory, and support circuits, e.g., input/output circuitry, power supplies, clock circuits, cache, and the like. The memory is connected to the CPU. The memory is a non-transitory computable readable medium, and can be one or more readily available memory such as random access memory (RAM), read-only memory (ROM), floppy disk, hard disk, or another form of digital storage. In addition, although illustrated as a single computer, the controller 190 could be a distributed system, e.g., including multiple independently operating processors and memories.

The polishing apparatus 100 also includes an in-line (also referred to as in-sequence) optical metrology system 160. A color imaging system of the in-line optical metrology system 160 is positioned within the polishing apparatus 100, but does not perform measurements during the polishing operation; rather measurements are collected between polishing operations, e.g., while the substrate is being moved from one polishing station to another, or pre- or post-polishing, e.g., while the substrate is being moved from the transfer station to a polishing station or vice versa. In addition, the in-line optical metrology system 160 can be positioned in a fab interface unit or a module accessible from the fab interface unit to measure a substrate after the substrate is extracted from a cassette but before the substrate is moved to the polishing unit, or after the substrate has been cleaned but before the substrate is returned to the cassette.

The in-line optical metrology system 160 includes a sensor assembly 161 that provides the color imaging of the substrate 10. The sensor assembly 161 can include a light source 162, a light detector 164, and circuitry 166 for sending and receiving signals between the controller 190 and the light source 162 and light detector 164.

The light source 162 can be operable to emit white light. In one implementation, the white light emitted includes light having wavelengths of 200-800 nanometers. A suitable light source is an array of white-light light-emitting diodes (LEDs), or a xenon lamp or a xenon mercury lamp. The light source 162 is oriented to direct light 168 onto the exposed surface of the substrate 10 at a non-zero angle of incidence a. The angle of incidence a can be, for example, about 30° to 75°, e.g., 50°.

The light source can illuminate a substantially linear elongated region that spans the width of the substrate 10. For example, the light source 162 can include optics, e.g., a beam expander, to spread the light from the light source into an elongated region. Alternatively or in addition, the light source 162 can include a linear array of light sources. The light source 162 itself, and the region illuminated on the substrate, can elongate and have a longitudinal axis parallel to the surface of the substrate.

A diffuser 170 can be placed in the path of the light 168, or the light source 162 can include a diffuser, to diffuse the light before it reaches the substrate 10.

The detector 164 is a color camera that is sensitive to light from the light source 162. The camera includes an array of detector elements. For example, the camera can include a CCD array. In some implementations, the array is a single row of detector elements. For example, the camera can be a line-scan camera. The row of detector elements can extend parallel to the longitudinal axis of the elongated region illuminated by the light source 162. Where the light source 162 includes a row of light-emitting elements, the row of detector elements can extend along a first axis parallel to the longitudinal axis of the light source 162. A row of detector elements can include 1024 or more elements.

The camera 164 is configured with appropriate focusing optics 172 to project a field of view of the substrate onto the array of detector elements. The field of view can be long enough to view the entire width of the substrate 10, e.g., 150 to 300 mm long. The camera 164, including associated optics 172, can be configured such that individual pixels correspond to a region having a length equal to or less than about 0.5 mm. For example, assuming that the field of view is about 200 mm long and the detector 164 includes 1024 elements, then an image generated by the line-scan camera can have pixels with a length of about 0.5 mm. To determine the length resolution of the image, the length of the field of view (FOV) can be divided by the number of pixels onto which the FOV is imaged to arrive at a length resolution.

The camera 164 can be also be configured such that the pixel width is comparable to the pixel length. For example, an advantage of a line-scan camera is its very fast frame rate. The frame rate can be at least 5 kHz. The frame rate can be set at a frequency such that as the imaged area scans across the substrate 10, the pixel width is comparable to the pixel length, e.g., equal to or less than about 0.3 mm.

The light source 162 and the light detector 164 can be supported on a stage 180. Where the light detector 164 is a line-scan camera, the light source 162 and camera 164 are movable relative to the substrate 10 such that the imaged area can scan across the length of the substrate. In particular, the relative motion can be in a direction parallel to the surface of the substrate 10 and perpendicular to the row of detector elements of the line-scan camera 164.

In some implementations, the stage 182 is stationary, and the support for the substrate moves. For example, the carrier head 126 can move, e.g., either by motion of the carriage 108 or by rotational oscillation of the carousel, or the robot arm holding the substrate in a factory interface unit can move the substrate 10 past the line-scan camera 182. In some implementations, the stage 180 is movable while the carrier head or robot arm remains stationary for the image acquisition. For example, the stage 180 can be movable along a rail 184 by a linear actuator 182. In either case, this permits the light source 162 and camera 164 to stay in a fixed position relative to each other as the area being scanned moves across the substrate 10.

A possible advantage of having a line-scan camera and light source that move together across the substrate is that, e.g., as compared to a conventional 2D camera, the relative angle between the light source and the camera remains constant for different positions across the wafer. Consequently, artifacts caused by variation in the viewing angle can be reduced or eliminated. In addition, a line scan camera can eliminate perspective distortion, whereas a conventional 2D camera exhibits inherent perspective distortion, which then needs to be corrected by an image transformation.

The sensor assembly 161 can include a mechanism to adjust vertical distance between the substrate 10 and the light source 162 and detector 164. For example, the sensor assembly 161 can include an actuator to adjust the vertical position of the stage 180.

Optionally a polarizing filter 174 can be positioned in the path of the light, e.g., between the substrate 10 and the detector 164. The polarizing filter 174 can be a circular polarizer (CPL). A typical CPL is a combination of a linear polarizer and quarter-wave plate. Proper orientation of the polarizing axis of the polarizing filter 174 can reduce haze in the image and sharpen or enhance desirable visual features.

Assuming that the outermost layer on the substrate is a semitransparent layer, e.g., a dielectric layer, the color of light detected at detector 164 depends on, e.g., the composition of the substrate surface, substrate surface smoothness, and/or the amount of interference between light reflected from different interfaces of one or more layers (e.g., dielectric layers) on the substrate. As noted above, the light source 162 and light detector 164 can be connected to a computing device, e.g., the controller 190, operable to control their operation and receive their signals. The computing device that performs the various functions to convert the color image to a thickness measurement, can be considered part of the metrology system 160.

Figure 2:
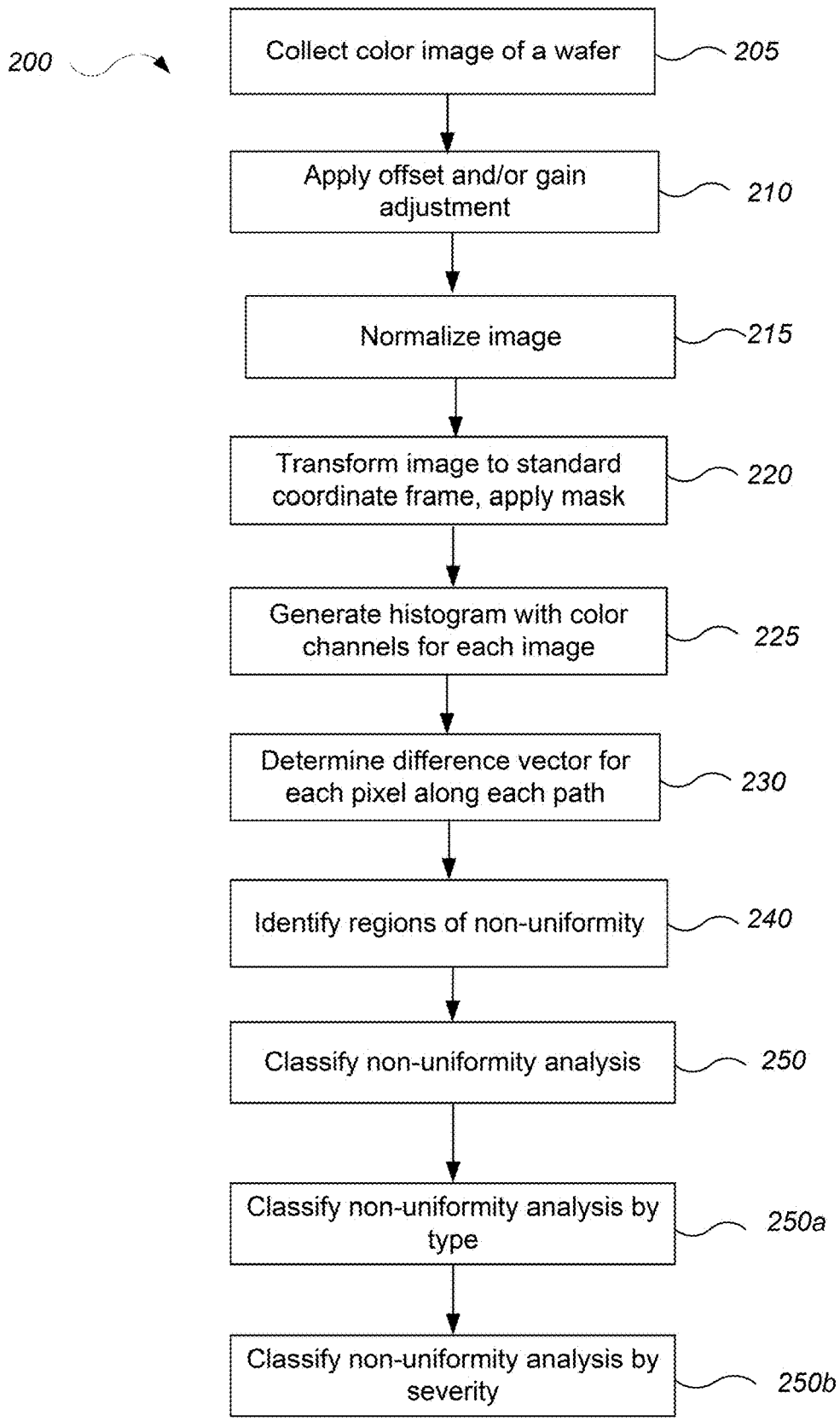
FIG. 2 illustrates a flow chart for a method of classifying a non-uniformity of a film on a substrate using computational approach.

FIG. 2 illustrates a method 200 of image processing for use in detecting and classifying abnormality in a film on a substrate. The method can be performed by the controller 190. The controller 190 receives a color image of the substrate. The color images can be RGB images, or images in another color space, e.g., XYZ or HCL.

The controller executes an image processing algorithm that processes the color images. The controller assembles individual image lines from the light detector 164 into a two-dimensional color image (step 205). The controller can apply an offset and/or a gain adjustment to the intensity values of the pixels in the image in each color channel (step 210). Each color channel can have a different offset and/or gain. Optionally, the image can be normalized (step 215). For example, the difference between the measured image and a standard predefined image can be calculated. For example, the controller can store a background image for each of the red, green, and blue color channels, and the background image can be subtracted from the measured image for each color channel. The image can also be transformed, e.g., scaled and/or rotated and/or translated, into a standard image coordinate frame (step 220). For example, the image can be translated so that the substrate center is at the center point of the image and/or the image can be scaled so that the edge of the substrate is at the edge of the image, and/or the image can be rotated so that there is a Wangle between the x-axis of the image and the radial segment connecting the substrate center and the substrate orientation feature, e.g., the notch or flat of the wafer. The substrate orientation can be determined by a notch finder, or by image processing of the color image 320, e.g., to determine the angle of scribe lines in the image. The substrate position can also be determined by image processing of the color image 320, e.g., by detecting the circular substrate edge and then determining a center of the circle.

A mask can be applied to an image. The mask can eliminate unwanted pixels, e.g., pixels from the portions of the substrate corresponding to the scribe lines, from the computation. As an example, the controller 190 can store a die mask that identifies a location and area of interest in the image. For example, for rectangular regions, the area can be defined by upper right and lower left coordinates in the image. Thus, the mask could be a data file that includes a pair of an upper right and a lower left coordinate for each region. In other cases, where regions are non-rectangular, more complex functions can be used. In some implementations, substrate orientation and position can be determined, and the die mask can be aligned with respect to the image.

Figure 3A:
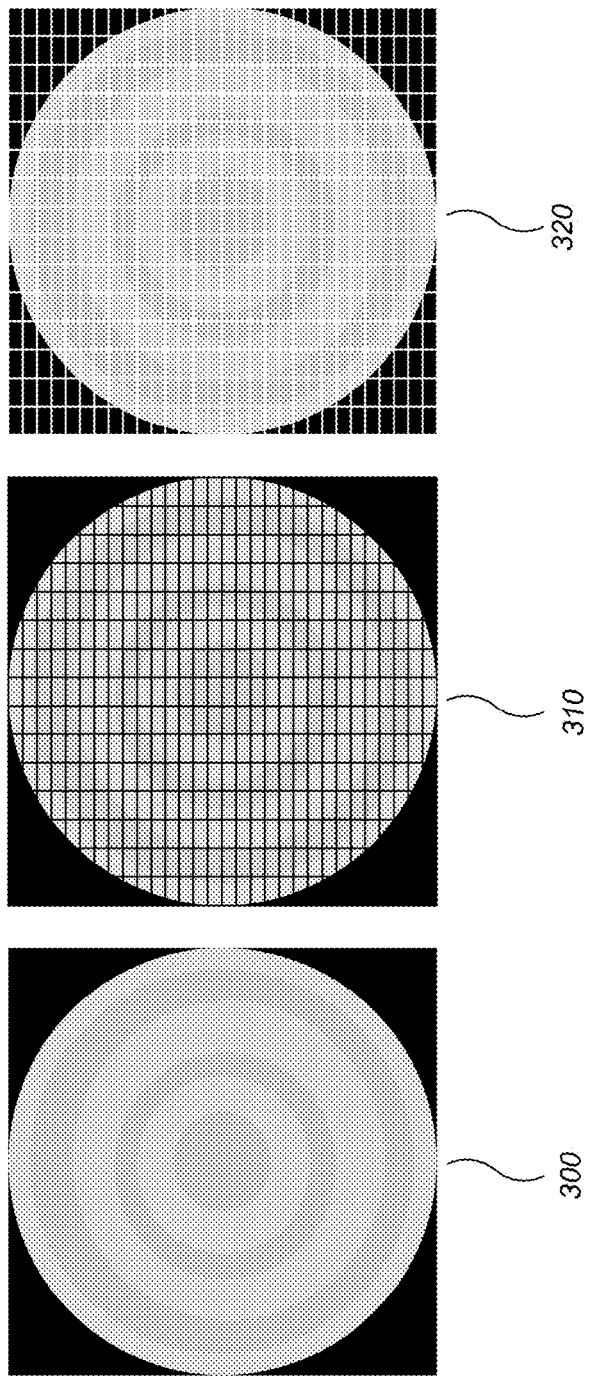
FIG. 3A illustrates a mask being applied to an exemplary image of a substrate used for computational analysis.

Referring to FIG. 3A, an example of an image 300 of a substrate 10 collected with in-line optical metrology system 160 is shown. The in-line optical metrology system 160 produces a color image 300 with at least three color channels, e.g., RGB channels. The image can be a high-resolution image, e.g., an image of at least 720×1080 pixels high-resolution, although lower resolution, e.g., down to 150×150 pixels, or higher resolution, can be used. The color at any particular pixel depends on the thickness of one or more layers, including the top layer, in the area of the substrate corresponding to the pixel. FIG. 3A shows an image 310 of a mask overlaid on the image of the substrate to produce a masked image 320.

Figure 3B:
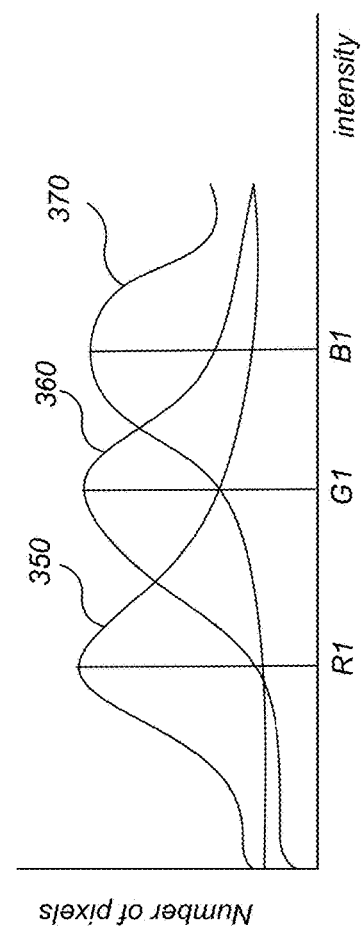
FIG. 3B illustrates graph of histograms of three color channels.

The algorithm determines the a "uniform color" for the unmasked portion of the image (step 225). In some implementations, an intensity histogram is determined for each color channel, and the algorithm finds the peak in each of the three histograms (R, G, and B planes). The tuple of intensity values from the peaks in the histograms provides a color value. This color value is termed the "uniform color" (UC) of the image 300. For example, FIG. 3B illustrates histograms 350, 360, 370 for the red, green and blue channels respectively, and the peaks at R1, G1 and B1 for each histogram. The tuple (R1, G1, B1) provides the uniform color. However, other techniques could be used to define a uniform color, e.g., simply calculating a mode value or mean value for each channel.

The color images collected can be stored as PNG images for further analysis or processing, although many other formats, e.g., JPEG, etc., are possible.

Returning to FIG. 2, the masked image can be fed into the image processing algorithm. The controller can store data defining a plurality of paths across the image. 15 For example, the paths can be lines extending radially outward from the center of the substrate (see line 406 in FIG. 4A), although other paths are possible. For radial lines, the lines can be positioned at equal angular intervals, e.g., 1-10°, around the center of the substrate.

For each path, the controller computes the difference vector (DV) between each pixel in the sequence of pixels along the path and the uniform color (UC) (step 230). The difference vector can be represented as a tuple, e.g., ($D_R$, $D_G$, $D_B$). The difference vector of the pixels can be represented either by Cartesian or by spherical coordinates within the computation algorithm as shown below:

$DV=(D_r,D_g,D_b)$ where $D_X=X-PPMEAN_X$ where $X=R, G, or B$ (Cartesian Coordinates)

$DV=(\rho,\Theta,\phi)$ where $\rho=\sqrt{D_r^2+D_g^2+D_b^2}$ $\theta=\tan^{-1}(D_g/D_r)$ $\varphi=\tan^{-1}(D_b/S)$ (Spherical Coordinates)

where $S=\sqrt{D_r^2+D_g^2}$ is the projection of DV onto (RG) plane.

The sequence of difference vectors along a particular path provide a difference vector profile. Each difference vector profile is analyzed to detect regions or segments along the radial profile that are non-uniform (step 240).

In some implementations, uniform regions are distinguished from non-uniform regions by using a threshold value. Pixels for which a magnitude of the difference vector (e.g., calculated as conventional Euclidian distance) is above the threshold value are classified as "non-uniform." In contrast, pixels for which a magnitude of the difference vector is below the threshold value are classified as "uniform." In some implementations, the region interpretation can be set automatically by using machine learning.

In some implementations, the controller established four possible classifications for a pixel: properly polished (type 1), underpolished (type 2), over-polished (type 3), or non-uniformly polished but unclassified or anomalous (type 4).

The algorithm first divides the path into groups of contiguous properly polished pixels and groups of contiguous unclassified pixels. For a selected pixel if the prior pixel was properly polished, but a magnitude of the difference vector (MagDV) is greater than the threshold value, then a new non-uniform region (i.e., nonPP or type4) is identified. The algorithm continues to group pixels along the path into the identified non-uniform region until a number of sequential properly polished pixels are encountered. By repeating this process along the path, the pixels are divided into groups of normal pixels and groups of abnormal pixels. An "nSustain" parameter can be used as a noise filter to determine how long a sequence of adjacent pixels is required to start a region of a new type. For example, if a type1 (i.e. normal pixel) region is shorter than the nSustain parameter value, then those type1 pixels are assigned to the adjacent region of type 4 (i.e. not normal pixels).

Having divided the pixels along the path into groups, the type of abnormality, e.g., underpolished (type 2) or overpolished (type 3), can classified for each group (step 250). The type of abnormality can be determined by examining the difference vectors, and in particular the difference vectors at the start of a group of abnormal pixels. Without being limited to any particular theory, although color values at the center of a non-uniform region can match, the transition from a PP region to an under-polished (i.e., UP or type2) region can be different that the transition from a PP region to an over-polished (i.e., OP or type3) region.

In some implementations, a value F is calculated based on the ratio of differences in certain color channels. For example, F can be calculated based on a sum of a first ratio of differences in two color channels and a second ratio of differences in two color channels. The value F can then be compared to one or two threshold values to determine whether the region is underpolished (type 2) or overpolished (type 3). If the F does not satisfy either threshold, then the region can be identified as an anomaly, e.g., remain type 4.

In some implementations, F and the type of abnormality is determined according to the following function:

$$RGBSeqRatio = F = \frac{D_g}{D_r} + \frac{D_b}{D_r} \quad \begin{array}{l} \text{If } (F > FT1) \text{ Then } Type2(UP) \\ \text{Else if } (F < FT2) \text{ Then } Type2(OP) \\ \text{Else Anomaly} \end{array}$$

where $D_R$, $D_G$ and $D_B$ are the difference values for the red, green and blue color channels, and FT1 and FT2 are empirically determined threshold values.

A preset number of pixels in a nonPP region that are sequential along the path beginning at a neighboring PP region are evaluated. The preset number of pixels can be selected by a user, e.g., by user input. The classification sequence is performed by looking at 3-10 pixels, e.g., 3-5 pixels (e.g., one region can be 50-60 pixels wide) and computing the ratio of differences. For example, for each pixel in a sequence of N pixels, the controller computes the factor (F) to provide F1, F2, F3, . . . , FN. Each calculated F, i.e., F1, F2, F3, . . . , FN, is compared to each threshold values FT1, FT2, . . . , FTn. If all pixels satisfy the same condition, e.g., F1, FN are all less than FT1 or are all greater than FT2, then the region is classified as "overpolished" or "underpolished." Otherwise it is classified as an unclassified non-uniformity or abnormality.

In another implementation, the interpretation between underpolished or overpolished can be evaluated using spherical coordinate angles (e.g., Θ and ϕ) of the DV points in type 4 regions (i.e., the points that are adjacent to the neighboring type 1 region). Therefore, the sequence for determining UP or OP is a) set upper and lower thresholds for Θ and ϕ for UP behavior; b) analyze several PP adjacent points in the type4 region; and c) if Θ and φ fall within the type2 ranges then classify as type 2 else, classify as type3.

Based on the computed data the "non-uniformity" can be further classified (step 250) by type (step 250*a*) and by severity (step 250*b*). Similarly as in the previous steps, the color image is inputted into the image-processing algorithm and divided into volumes then DV is computed for each volume. For each non-uniform region the severity is determined by quasi-quantitative description such as "mild", "moderate", or "severe." This is executed for each radial profile by transforming sets of RGB pixels in the non-uniform region to the rg chromaticity space. Then the area of the bounding rectangle (BRA) (414 in FIG. 4C, 508 in FIG. 5B, or 510 in FIG. 5C) of the non-uniform pixel sequence in the rg space is computed. Then the BRA is compared to areas of thresholds to determine the level of severity. For example, if there are two thresholds A1 and A2 with A1<A2, if BRA is less then A1, then classify as "mild". If BRA is between A1 and A2, then classify as "moderate". If BRA is greater than A2, then classify as "severe". As described, there are only three categories listed however, the algorithm can have more or less than three categories based on the number of the area thresholds.

As another method of determining severity, an arc length of the rg sequence can be computed (instead of the BRA). This may be more difficult, although should be in correspondence to the underlying theory. However, computation of the bounding rectangle is computationally easier and appears sufficient for accuracy.

Figure 4A:
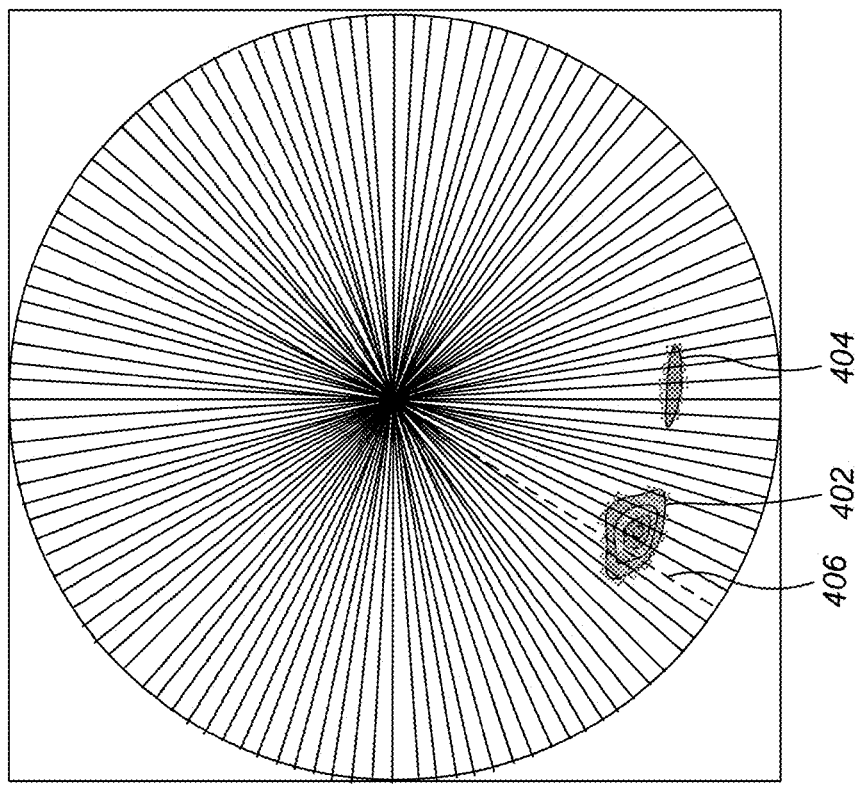
FIGS. 4A-4C illustrate an example of exemplary image of a substrate with a radial profile and results of non-uniformity analysis.
Figure 4B:
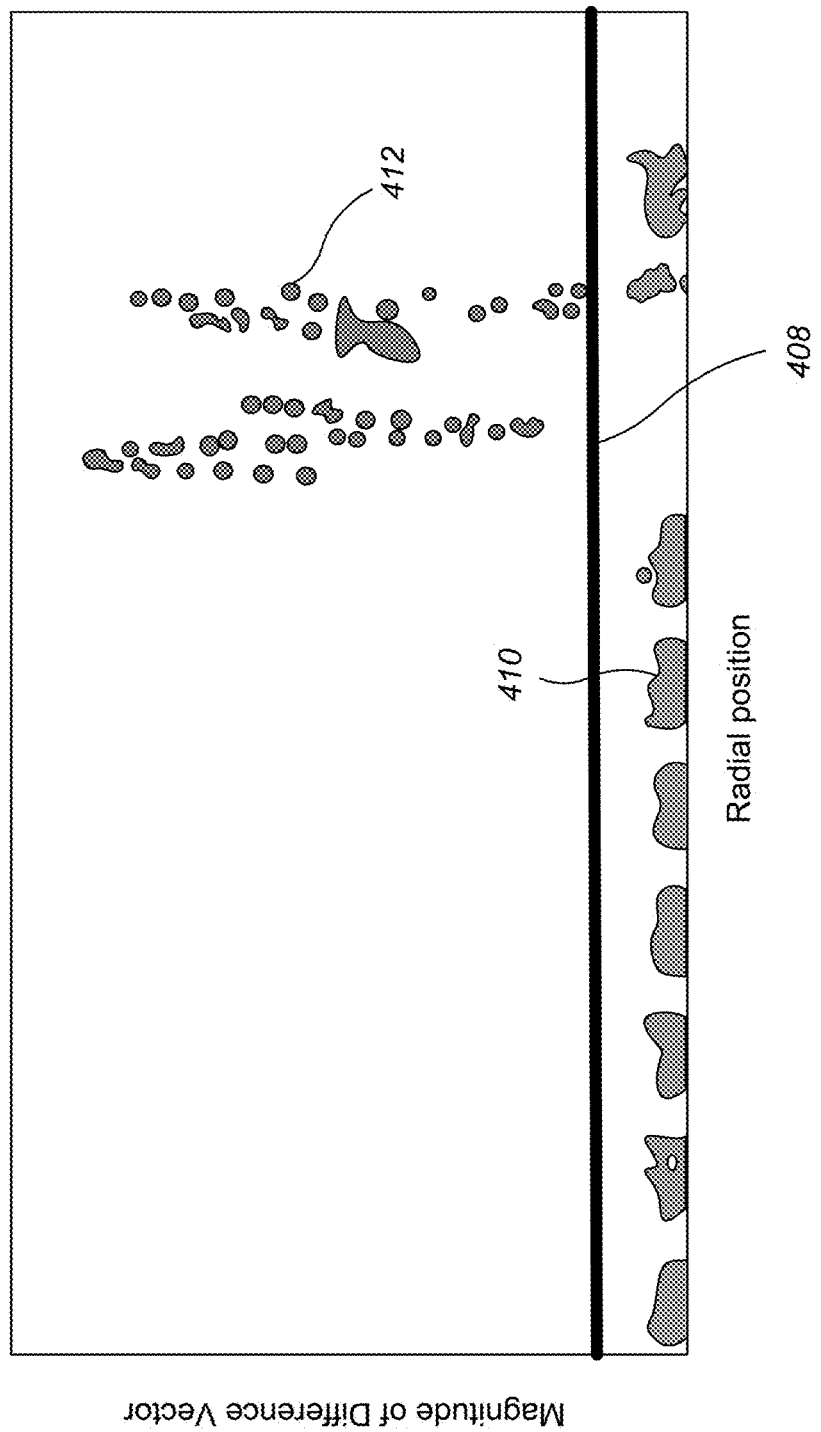
Figure 4C:
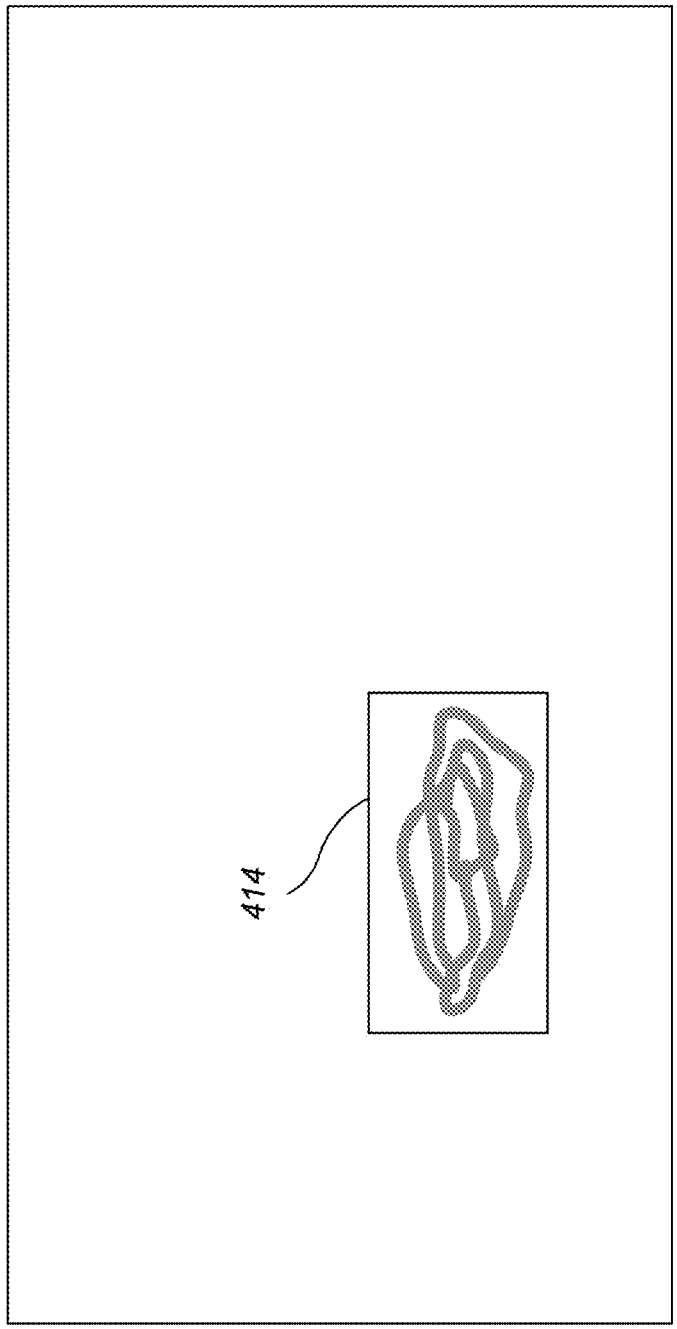

Referring to FIGS. 4A-4C, a first example of an exemplary image 400 of a substrate with a radial profile is illustrated showing non-uniform regions 402 and 404 with "severe" level of abnormality. The severe level is classified and presented by data in chart shown in FIG. 4B. The line 408 indicates threshold level the data above 412 the threshold line 408 is non-uniform and the data below 410 the threshold line 408 is uniform. The size of the area of the BRA 414 [area] is computed and presented in FIG. 4C confirming the severe non-uniformity of this radial profile 400.

Figure 5A:
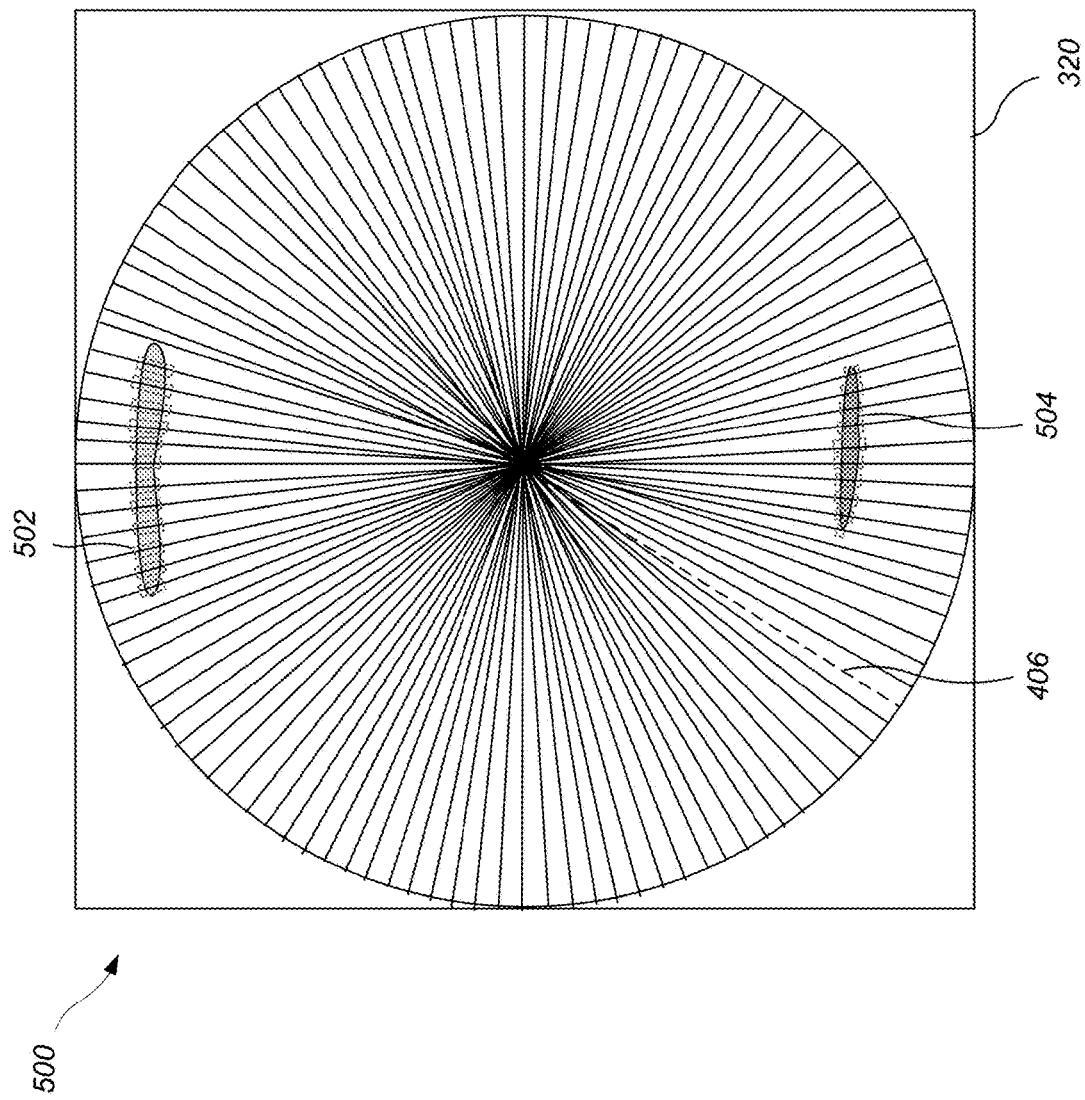
FIGS. 5A-5C illustrate another example of exemplary image of a substrate with a radial profile and results of non-uniformity analysis.
Figure 5B:
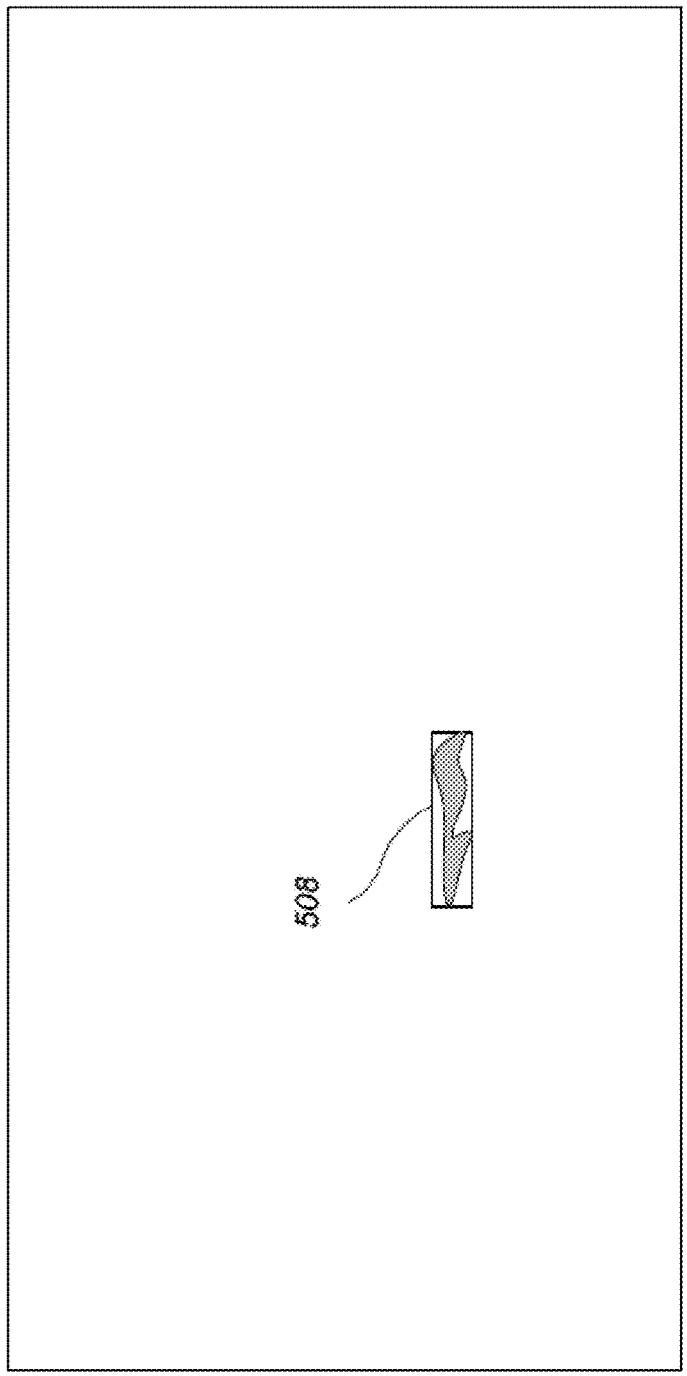
Figure 5C:
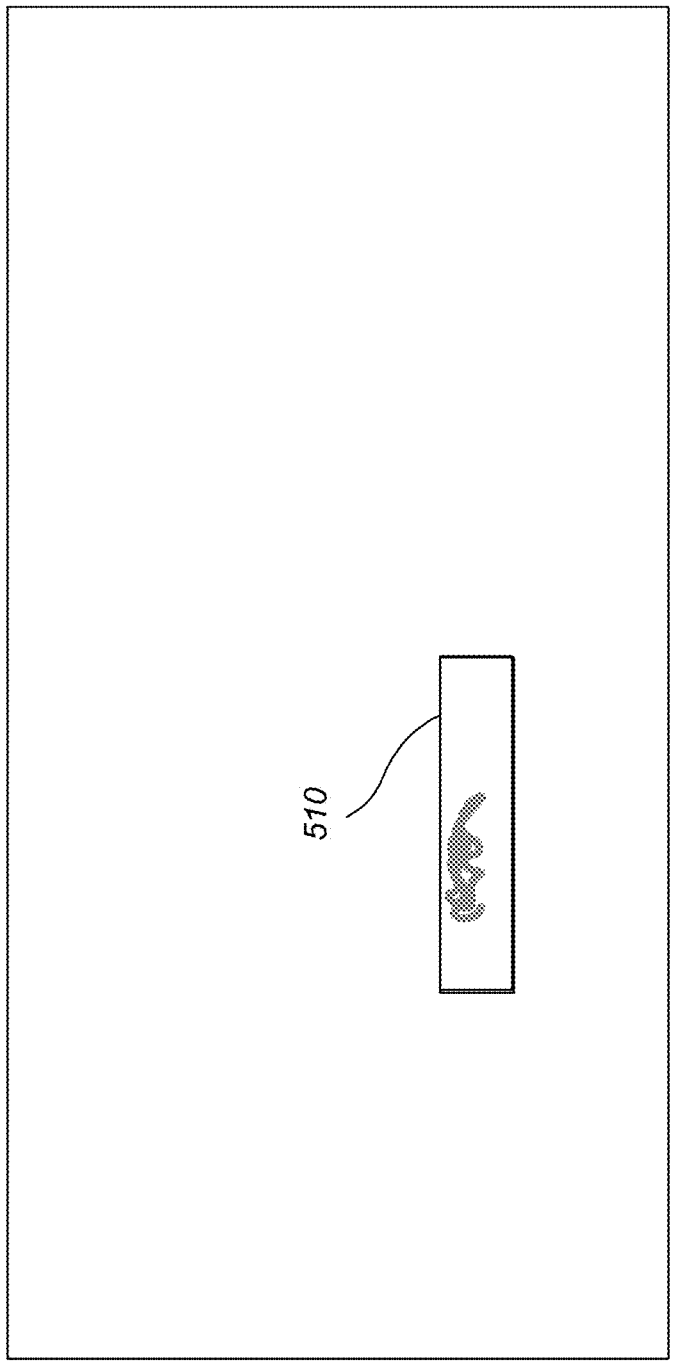

FIGS. 5A-5C illustrate another example of exemplary image 500 of a substrate with a radial profile showing a case of mild to moderate non-uniformity in regions 502 and 504. FIG. 5B shows a mild non-uniformity in BRA 508. FIG. 5C shows a moderate non-uniformity in BRA 510.

In general, data can be used to control one or more operation parameters of the CMP apparatus. Operational parameters include, for example, platen rotational velocity, substrate rotational velocity, the polishing path of the substrate, the substrate speed across the plate, the pressure exerted on the substrate, slurry composition, slurry flow rate, and temperature at the substrate surface. Operational parameters can be controlled real-time and can be automatically adjusted without the need for further human intervention.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Embodiments of the invention and all of the functional operations described in this specification can be implemented in digital electronic circuitry, or in computer software, firmware, or hardware, including the structural means disclosed in this specification and structural equivalents thereof, or in combinations of them.

Embodiments of the invention can be implemented as one or more computer program products, i.e., one or more computer programs tangibly embodied in a non-transitory machine readable storage media, for execution by, or to control the operation of, data processing apparatus, e.g., a programmable processor, a computer, or multiple processors or computers.

Terms of relative positioning are used to denote positioning of components of the system relative to each other, not necessarily with respect to gravity; it should be understood that the polishing surface and substrate can be held in a vertical orientation or some other orientations.

A number of implementations have been described. Nevertheless, it will be understood that various modifications may be made. For example Rather than a line scan camera, a camera that images the entire substrate could be used. In this case, motion of the camera relative to the substrate is not needed.

The camera could cover less than the entire width of the substrate. In this case, the camera would need to undergo motion in two perpendicular directions, e.g., be supported on an X-Y stage, in order to scan the entire substrate.

The light source could illuminate the entire substrate. In this case, the light source need not move relative to the substrate.

The light detector can be a spectrometer rather than a color camera; the spectra data can then be reduced to the RGB color space.

The sensor assembly need not an in-line system positioned between polishing stations or between a polishing station and a transfer station. For example, the sensor assembly could be positioned within the transfer station, positioned in a cassette interface unit, or be a stand-alone system.

Accordingly, other implementations are within the scope of the claims.

What is claimed is:

1. A non-transitory computer readable medium comprising a computer program to classify a film non-uniformity on a substrate, the computer program including instructions to cause one or more computers to:
   obtain a color image of a substrate, the color image comprising a plurality of color channels;
   obtain a uniform color value for the color image of the substrate;
   for each respective pixel along a path in the color image, determine a difference vector between a color of the respective pixel and the uniform color value to generate a sequence of difference vectors; and
   classify the pixels along the path as normal or abnormal based on the sequence of difference vectors;
   group the pixels into one or more regions in response to the pixels being identified as normal or abnormal; and
   classify a region having abnormal pixels as overpolished or underpolished based on at least one difference vector using only a pixel at a boundary between the region having abnormal pixels and an adjacent region having normal pixels and not a pixel that is not at the boundary.

2. The computer readable medium of claim 1, comprising instructions to classify the region having abnormal pixels as overpolished or underpolished based on a multiplicity of difference vectors for each of a multiplicity of successive pixels along the path at the boundary.

3. The computer readable medium of claim 2, wherein the multiplicity of successive pixels is no more than 5 pixels.

4. The computer readable medium of claim 2, comprising instructions to classify the region having abnormal pixels as overpolished or underpolished based on each of the multiplicity of difference vectors meeting a criterion.

5. The computer readable medium of claim 2, wherein the instructions to classify the region having abnormal pixels as overpolished or underpolished include instructions to calculate a factor based on a ratio of difference values in two color channels.

6. The computer readable medium of claim 5, wherein the instructions to calculate the factor include instructions to calculate a sum of a first ratio of difference values in a first two color channels and a second ratio of difference values in a second two color channels.

7. The computer readable medium of claim 5, wherein the instructions to classify the region having abnormal pixels as overpolished or underpolished regions include instructions to compare the factor to at least a first threshold value.

8. The computer readable medium of claim 7, comprising instructions to classify the region having abnormal pixels as underpolished in response to determining that the factor exceeds the first threshold value.

9. The computer readable medium of claim 7, comprising instructions to classify the region having abnormal pixels as overpolished in response to determining that the factor does not exceed a second threshold value, the second threshold value being different than the first threshold value.

10. The computer readable medium of claim 6, wherein the first two color channels are green and red and the second two color channels are blue and red.

11. The computer readable medium of claim 1, comprising instructions to determine a severity of the region having abnormal pixels based on the multiplicity of the difference vectors.

12. The computer readable medium of claim 11, wherein determining the severity comprises determining a minimum bounding region containing the difference vectors for the pixels in the region having abnormal pixels in a color space at least two of the color channels, and comparing an area of the bounding region to a third threshold value, the third threshold value.

13. The computer readable medium of claim 12, wherein the minimum bounding region comprises a rectangle.

14. A method of classification of a film non-uniformity on a substrate, comprising:
  obtaining a color image of a substrate, the color image comprising a plurality of color channels;
  obtaining a uniform color value for the color image of the substrate;
  for each respective pixel along a path in the color image, determining a difference vector between a color of the respective pixel and the uniform color value to generate a sequence of difference vectors;
  grouping the pixels along the path into a plurality of regions including at least one normal region and at least one abnormal region based on the sequence of difference vectors; and
  classifying the at least one abnormal region as overpolished or underpolished based on at least one difference vector using only a pixel at a boundary between the region having abnormal pixels and an adjacent region having normal pixels and not a pixel that is not at the boundary.

15. The method of claim 14, wherein obtaining the color image includes scanning the substrate with an in-line metrology system including a line-scan imager.

16. A polishing system, comprising:
  a polisher to polish a substrate;
  an in-line metrology system to obtain to color image of a substrate, the color image comprising a plurality of color channels; and
  a controller configured to
    receive obtain the color image from the in-line metrology system,
    obtaining a uniform color value for the color image of the substrate,
    for each respective pixel along a path in the color image, determine a difference vector between a color of the respective pixel and the uniform color value to generate a sequence of difference vectors,
    classify the pixels along the path as normal or abnormal based on the sequence of difference vectors,
    group the pixels into one or more regions in response to the pixels being identified as normal or abnormal,
    classify a region having abnormal pixels as overpolished or underpolished based on at least one difference vector using only a pixel at a boundary between the region having abnormal pixels and an adjacent region having normal pixels and not a pixel that is not at the boundary, and
    adjust a polishing parameter of the polisher for a region having pixels identified as abnormal based on the region being classified as overpolished or underpolished.

17. The polishing system of claim 16, wherein the controller is configured to classify the region as overpolished or underpolished based a multiplicity of difference vectors for each of a multiplicity of successive pixels along the path at the boundary.

18. The polishing system of claim 17, wherein the controller is configure to classify the region as overpolished or underpolished based on each of the multiplicity of difference vectors meeting a criterion.

19. The polishing system of claim 16, wherein the controller is configured to determine a severity of the region having abnormal pixels based on the multiplicity of the difference vectors.

20. The polishing system of claim 19, wherein the controller is configured to determine the severity by determining a minimum bounding region containing the difference vectors for the pixels in the region having abnormal pixels in a color space at least two of the color channels, and comparing an area of the bounding region to a fifth threshold value.

* * * * *

UNITED STATES PATENT AND TRADEMARK OFFICE
CERTIFICATE OF CORRECTION

PATENT NO. : 12,288,724 B2
APPLICATION NO. : 17/680167
DATED : April 29, 2025
INVENTOR(S) : Dominic J. Benvegnu and Nojan Motamedi Page 1 of 1

It is certified that error appears in the above-identified patent and that said Letters Patent is hereby corrected as shown below:

On the Title Page

Column 2 item (57) (Abstract), Line 6, After "between" delete "the";

In the Claims

Column 11, Line 41-42, In Claim 12, after "threshold" delete "value, the third threshold";

Column 12, Line 45, In Claim 18, delete "configure" and insert -- configured --.

Signed and Sealed this
First Day of July, 2025

Coke Morgan Stewart
*Acting Director of the United States Patent and Trademark Office*